United States Patent
Tehrani et al.

[11] Patent Number: 5,920,500
[45] Date of Patent: Jul. 6, 1999

[54] MAGNETIC RANDOM ACCESS MEMORY HAVING STACKED MEMORY CELLS AND FABRICATION METHOD THEREFOR

[75] Inventors: Saied N. Tehrani, Tempe; Xiaodong T. Zhu, Chandler; Eugene Chen, Gilbert; Herbert Goronkin, Tempe, all of Ariz.

[73] Assignee: Motorola, Inc., Schaumburg, Ill.

[21] Appl. No.: 08/702,781

[22] Filed: Aug. 23, 1996

[51] Int. Cl.$^6$ .................................................. G11C 11/15
[52] U.S. Cl. .......................... 365/173; 257/108; 257/295; 257/427; 365/171; 365/174; 365/180
[58] Field of Search .................................. 257/108, 295, 257/427, 306, 920; 365/171, 173, 174, 180, 74, 130

[56] References Cited

U.S. PATENT DOCUMENTS

| | | | |
|---|---|---|---|
| 4,455,626 | 6/1984 | Lutes | 365/158 |
| 5,347,485 | 9/1994 | Taguchi et al. | 365/171 |
| 5,398,200 | 3/1995 | Mazure et al. | 365/174 |
| 5,587,943 | 12/1996 | Torok et al. | 365/158 |
| 5,617,071 | 4/1997 | Daughton | 338/32 R |

*Primary Examiner*—Mahshid Saadat
*Assistant Examiner*—Allan R. Wilson
*Attorney, Agent, or Firm*—Eugene A. Parsons; William E. Koch

[57] ABSTRACT

A magnetic random access memory (10) has a plurality of stacked memory cells on semiconductor substrate (11), each cell basically having a portion of magnetic material (12), a word line (13), and sense line (14). Upper sense line (22) is electrically coupled to lower sense line (12) via conductor line (23) with ohmic contacts. In order to read and store states in the memory cell, lower and upper word lines (13, 18) are activated, thereby total magnetic field is applied to portion of magnetic material (11). This stacked memory structure allows magnetic random access memory (10) to integrate more memory cells on semiconductor substrate (11).

15 Claims, 3 Drawing Sheets

MAGNETIC RANDOM ACCESS MEMORY HAVING STACKED MEMORY CELLS AND FABRICATION METHOD THEREFOR

FIELD OF THE INVENTION

The present invention relates to a magnetic random access memory and its fabrication method, and more particularly, to the magnetic random access memory in which each memory cell is stacked in overlaying relationship on each other and its fabrication method.

BACKGROUND OF THE INVENTION

Many types of non-volatile memory devices have been researched and developed. A magnetic random access memory (MRAM) has been developed as one of non-volatile memory devices which features 'hardness to radiation'. A memory cell in the MRAM has basically a word line, a sense line, and a portion of magnetoresistive material which is typically giant magnetoresistive (GMR) material, all of which are formed on a semiconductor substrate. The word line is fabricated perpendicular to the sense line, and the portion of GMR material is placed at a crossing point of the word line and the sense line. The portion of GMR material stores information as states "0" and "1" which correspond to directions of magnetic vectors in GMR material. The states in the memory cell are stored and changed by applying a magnetic field over a predetermined threshold level to the portion of GMR material. A magnetic field generated by a word current is combined with a magnetic field generated by a sense current, and the total magnetic field is applied to the portion of the GMR material to read and store the states. The states stored in the memory cell are read out by sensing the voltage difference at the output terminal of the sense line because resistance of GMR material is alternated in accordance with directions of magnetic vectors.

The conventional MRAM integrates a plurality of memory cells on the semiconductor substrate. Since the memory cells are arranged on a plane and the memory cell requires a certain area, the number of memory cells integrated on the substrate is limited.

Accordingly, it is a purpose of the present invention to provide a new and improved magnetic random access memory with a high density of memory cells.

It is a further purpose of the present invention to provide a new and improved magnetic random access memory with high density and a low power consumption.

SUMMARY OF THE INVENTION

This need and others are substantially met through provision of a MRAM which has a plurality of memory cells stacked in overlying relationship on each other on a semiconductor substrate. Each memory cell has a portion of GMR material, a word line, and a sense line which is coupled to a sense line in another memory cell overlying the memory cell by a conductor. The portion of GMR material stores states. The word line adjacent to the portion of GMR material provides a word current which applies a magnetic field to the portion of GMR material. The sense line is electrically coupled to the portion of GMR material, and provides a sense current which senses the states stored in the portion of GMR material.

DETAILED DESCRIPTION OF THE PREFERRED EMBODIMENTS

Figure 1:
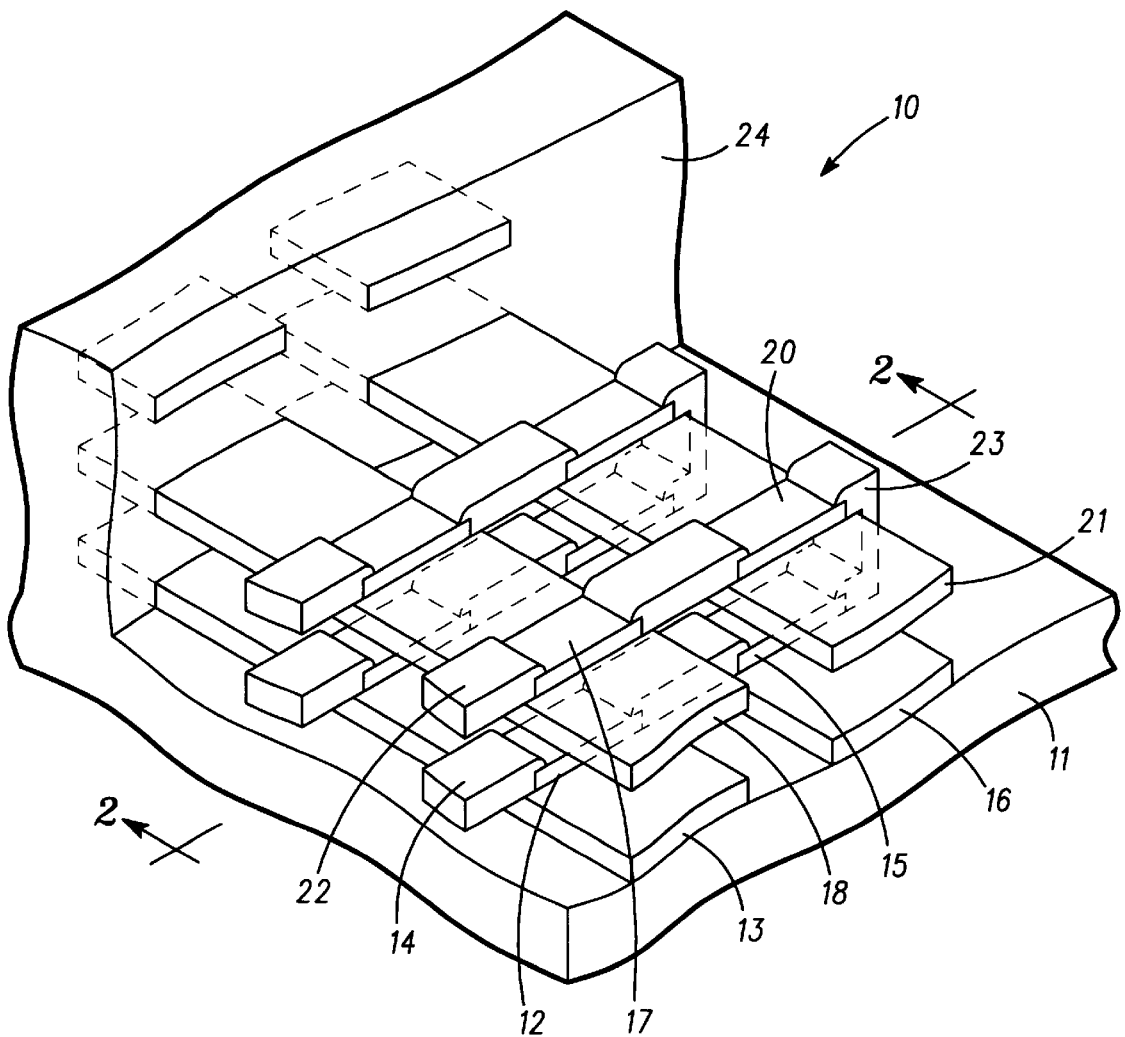
FIG. 1 is a simplified and enlarged perspective view illustrating a part of a MRAM in accordance with the present invention.
Figure 2:
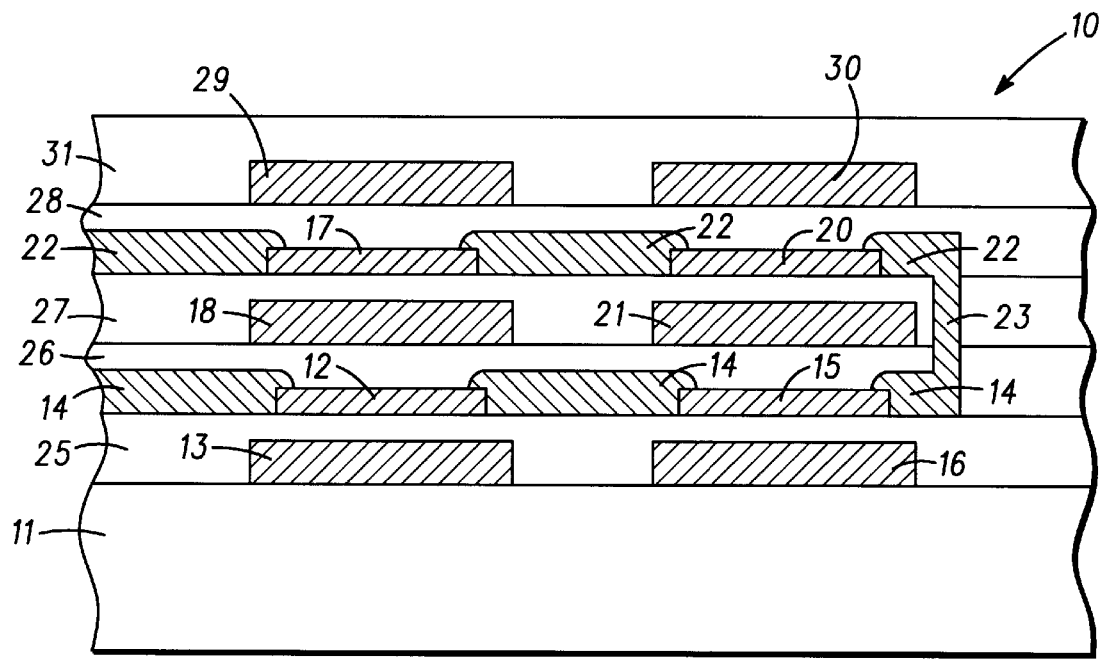
FIG. 2 is a simplified and enlarged cross-sectional view of a MRAM as seen from the line 2—2 of FIG. 1 according to an embodiment of the present invention.

FIG. 1 is a simplified and enlarged perspective view illustrating a part of an MRAM 10, and FIG. 2 is a cross-sectional view of MRAM 10 as seen from the line 2—2 of FIG. 1 according to an embodiment of the present invention. Elements of FIG. 2 that have the same reference numbers as FIG. 1 are the same as the corresponding FIG. 1 elements.

MRAM 10 shown in FIG. 1 contains eight memory cells stacked by two layers on a semiconductor substrate 11, and may be stacked by more layers. For simplicity, four memory cells connected to the same sense line are explained hereinafter. Each memory cell in MRAM 10 has a portion of GMR material, a word line, and a sense line. GMR material is typically composed of magnetic materials such as nickel or iron or cobalt or alloys thereof including alloys having palladium or platinum. The word line and the sense line are made of conductive material such as aluminum or copper or alloys thereof. A first memory cell has a first portion of magnetic memory 12, a first word line 13, and a sense line 14. Second, third and fourth memory cells have second, third and fourth portions of GMR material 15, 17 and 20, second, third and fourth word lines 16, 18 and 21, and a sense line 22 as well. Lower sense line 14 is electrically connected to portions of GMR material 12 and 15 with contacts, and coupled to upper sense line 22 via a conductor line 23 which utilizes the conductive material. A sense current is flowed through sense lines 14 and 22 and portions of GMR material 12, 15, 17 and 20 to sense resistance. Each word line is positioned adjacent to portions of GMR material 12, 15, 17 and 20 to apply a magnetic field generated by a word current to the portions of GMR material 12, 15, 17 and 20. Dielectric material 24 is filled among all the elements to provide electric insulation.

Referring to FIG. 2, first and second word lines 13 and 16, which are formed on semiconductor substrate 11 such as silicon, are formed by selectively etching metal deposited on semiconductor substrate 11. The metal is selected from, for example, aluminum (Al), copper (Cu), alloy thereof ($Al_{1-x}Cu_x$) or tungsten (W). A first dielectric layer 25, which is silicon dioxide ($SiO_2$) or silicon nitride ($Si_3N_4$), is deposited by chemical vapor deposition techniques to cover first and second word lines 13 and 16. After polishing an upper surface of dielectric layer 25 to be flat, first and second portions of GMR material 12 and 15 and sense line 14 are formed on the surface of dielectric layer 25. First and second portions of GMR material 12 and 15 are formed according to the following processes. First, a GMR layer is deposited on dielectric layer 25 and a dielectric mask layer is deposited and patterned using lithography to form an etch mask for the GMR material. Next, the GMR layer is etched to form first and second portions of GMR material 12 and 15, then the etch mask is removed.

Lower or first sense line 14, which is made of metal, for example, aluminum (Al), copper (Cu), or alloy thereof ($Al_{1-x}Cu_x$), is electrically connected to portions of GMR material 12 and 15 with ohmic contacts. Metal for sense line 14 is deposited on the surface of dielectric layer 25, then sense line 14 is etched using an etch mask which has been patterned on dielectric layer 25. After forming portions of GMR material 12 and 15 and lower sense line 14, dielectric layer 26 is deposited to cover portions of GMR material 12 and 15 and lower sense line 14.

An upper surface of dielectric layer 26 is polished to be flat before third and fourth word lines 18 and 21 are formed on dielectric layer 26 in accordance with the same process as first and second word lines 13 and 16. Dielectric layer 27 is deposited to cover third and fourth word lines 18 and 21, then portion of GMR material 17 and 20 and upper sense line 22 are formed on dielectric layer 27 by the same process as portions of GMR material 12 and 15 and lower sense line 14.

It is worthwhile to point out this although shown here in FIG. 1 and FIG. 2 sense lines in different levels are connected and intended to use the same transistor switch; when different sense transistors (not shown) are used for sense lines on different levels, then the sense lines do not need to be connected between different levels.

Upper sense line 22 is coupled to lower sense line 14 via conductor line 23 which is a conductive metal such as, for example, copper (Cu) and tungsten (W). Conductor line 23 is formed in accordance with the following processes. First, contact holes or vias communicating with lower sense line 14 are selectively and vertically etched by a reactive ion etching technique. Then, the metal shown above is filled in contact holes which form contacts with lower and upper sense lines 14 and 22. After forming contact line 23, dielectric layer 28 is deposited to cover portions of GMR material 17 and 20, upper sense line 22 and contact line 23. Then, the upper surface of dielectric layer 28 is polished to be flat to form fifth and sixth word lines 29 and 30 on dielectric layer 28 before dielectric layer 31 is deposited to cover fifth and sixth word lines 29 and 30.

When further memory cells are formed and stacked on fifth dielectric layer 31, the above processes are repeated to form portions on GMR material, word lines, sense lines, conductor lines, and dielectric layers.

In operation, in order to read the state in first, second, third, and fourth memory cells, a word current is applied to a word line and a voltage is sensed from sense line. For example, in order to read the state of the first memory cell, a word current is applied to first and third word lines 13 and 18 which put portion of GMR material 12 between them, and a voltage is sensed from sense lines 14 and 22 in which a sense current is flowed via conductor line 23. The direction of a word current in word line 13 is opposite to the direction of a word current in word line 18 so that magnetic field generated by the word current is applied to portion of GMR material 12 with the same direction. In order to store a state in first memory cell, for example, word current is applied to first and third word lines 13 and 18 to generate magnetic field which is strong enough to change the direction of magnetic vectors in portion of GMR material 12. As mentioned above, two word lines adjacent to portion of GMR material are activated using the same current to read and store the states, thereby less word current is required because magnetic fields generated by both word currents are superimposed in portion of GMR material 12.

Figure 3:
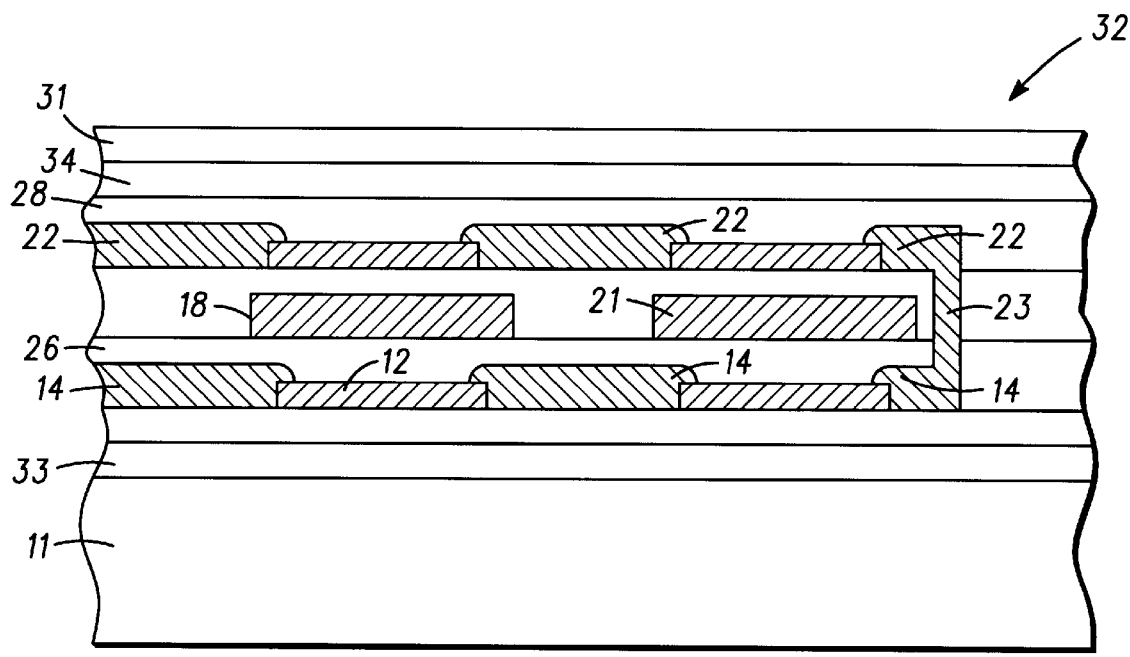
FIG. 3 is a simplified and enlarged cross-sectional view of a MRAM according to another embodiment of the present invention.

FIG. 3 is a simplified and enlarged cross-sectional view of a MRAM 32 according to a second embodiment of the present invention. Elements of FIG. 3 that have the same reference numbers as FIG. 2 are the same or equivalent as the corresponding FIG. 2 elements. And also, elements of FIG. 3 that have the same reference numbers as FIG. 2 are fabricated with the same or equivalent processes as the corresponding FIG. 2 processes.

The only difference between both structures shown in FIGS. 3 and 2, is digit lines which are formed instead of a part of word lines. First and second word lines 13 and 16 in FIG. 2 are replaced with first digit line 33 on semiconductor substrate 11, and fifth and sixth word lines 29 and 30 in FIG. 2 are replaced with second digit line 34 on fourth dielectric layer 28, respectively. Digit lines 33 and 34 are utilized to generate magnetic field in cooperation with third and fourth word lines 18 and 21. For example, in order to read the state in portion of GMR material 12, a word current and a digit current are applied to third word line 18 and first digit line 33 to provide magnetic field to portion of GMR material 12, and a voltage is sensed from first and second sense lines 14 and 22 in which a sense current is flowed via conductor line 23. When the states are stored into portion of GMR material 12, magnetic field enough to alternate the direction of the magnetic vectors in GMR material 12 is applied by the word current and the digit current. Although digit lines 33 and 34 are perpendicular to word lines 18 and 21, a magnetic field by a digit current assists rotating magnetic vectors in GMR material after applying a magnetic field by a word current. The direction of the word current and the digit current is determined according to the state to be stored.

Figure 4:
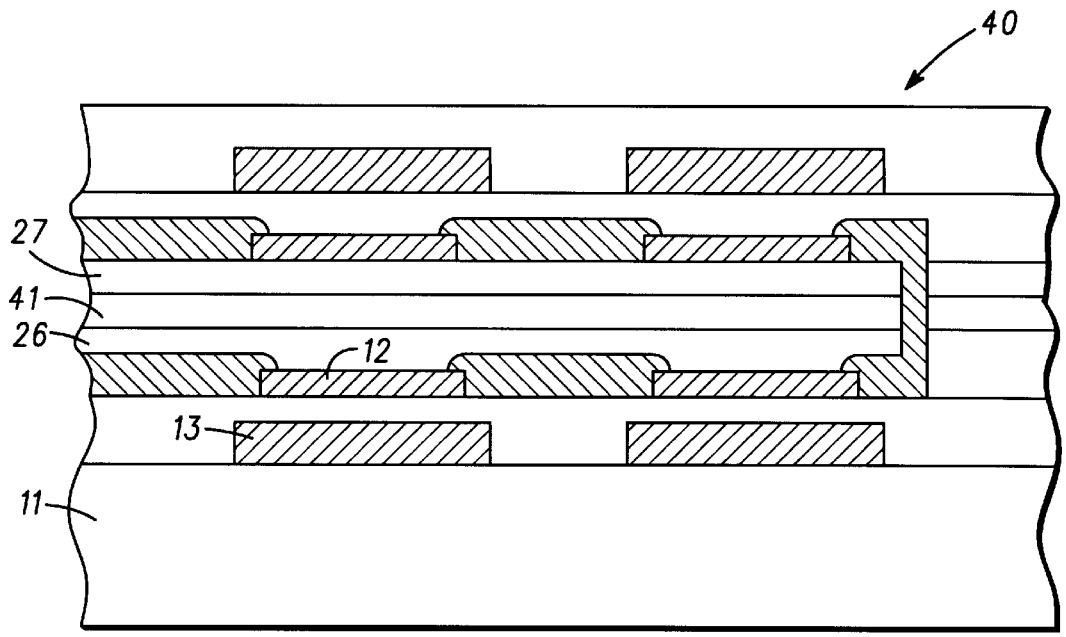
FIG. 4 is a simplified and enlarged cross-sectional view of a MRAM according to yet another embodiment of the present invention.

FIG. 4 is a simplified and enlarged cross-sectional view of a MRAM 40 according to a third embodiment of the present invention. Elements of FIG. 4 that have the same reference numbers as FIG. 2 are the same or equivalent as the corresponding FIG. 2 elements. And also, elements of FIG. 4 that have the same reference numbers as FIG. 2 are fabricated with the same or equivalent processes as the corresponding FIG. 2 processes.

The only difference between both structures shown in FIGS. 4 and 2, is a digit line which is formed instead of word lines. Third and fourth word lines 18 and 21 in FIG. 2 are replace by digit line 41 between second and third dielectric layers 26 and 27. The operation of MRAM 40 is the same as MRAM 32 shown in FIG. 3. That is, in order to read and store states in portion of GMR material 12, first word line 13 and digit line 41 are activated.

Figure 5:
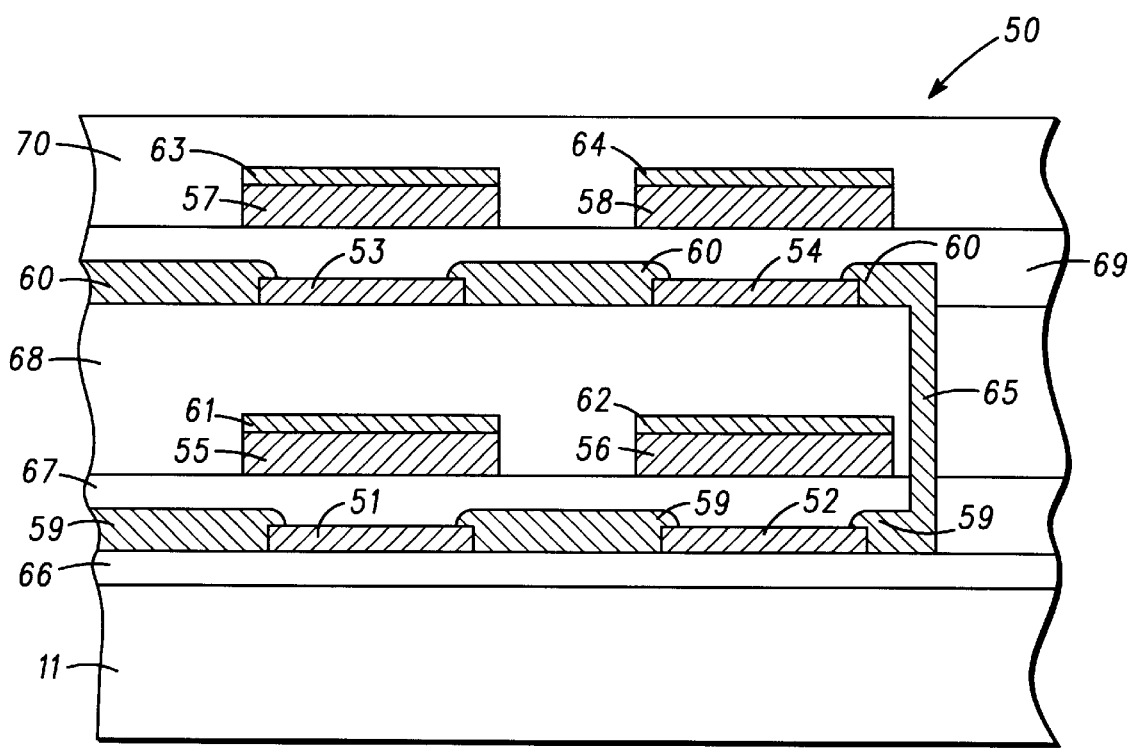
FIG. 5 is a simplified and enlarged cross-sectional view of a MRAM having flux concentrators according to still another embodiment of the present invention.

FIG. 5 is a simplified and enlarged cross-sectional view of a MRAM 50 having flux concentrators according to a fourth embodiment of the present invention. MRAM 50 shown in FIG. 5 includes two stacked layers on semiconductor substrate 11, each layer having a plurality of memory cells. More layers may be stacked on the two layers. Each memory cell has portions of GMR material 51, 52, 53 and 54, word lines 55, 56, 57 and 58, lower and upper sense lines 59 and 60, and flux concentrators 61, 62, 63 and 64. Lower sense line 59 is electrically coupled to upper sense line 60 via conductor line 65 with contacts.

First dielectric layer 66 is deposited on semiconductor substrate 11 such as Silicon (Si). Portions of GMR material 51 and 52 and lower sense line 59 are formed on the upper surface of first dielectric layer 66, then second dielectric layer 67 is deposited to cover portions of GMR material 51 and 52 and lower sense line 59. First and second word lines 55 and 56 are formed on second dielectric layer 67, then first and second flux concentrators are formed on first and second word lines before third dielectric layer 68 is deposited to cover first and second word lines 55 and 56 and first and second flux concentrators 61 and 62. In this embodiment, although first and second flux concentrators are formed on first and second word lines, first and second flux concentrators 61 and 62 can be placed at anywhere they are able to concentrate magnetic flux generated by a word current. Third dielectric layer 68 is deposited as thick as magnetic field from lower and upper layers does not magnetically affect to other GMR material.

After forming second sense line 60, conductor line 65 is vertically formed by the same process as second embodiment shown in FIG. 2 to electrically couple between lower and upper sense lines 59 and 60. Fourth dielectric layer 69 is deposited to cover portions of GMR material 53 and 54, upper sense line 60, and conductor line 65. Third and fourth word lines 57 and 58, and third and fourth flux concentrators 63 and 64 are formed on fourth dielectric layer 69 before fifth dielectric layer 70 is deposited to cover them. Flux concentrators 61, 62, 63, and 64 are formed of magnetic material having high permeability such as permalloy. Therefore, flux concentrators require less word current because more magnetic flux is concentrated into GMR material. Further, power consumption by word current can be reduced.

Thus, a new and improved MRAM and its fabrication method have been disclosed. Stacked memory cells are possible to integrate more memory cells on the semiconductor chip and attain a high density MRAM device. Further, MRAM having flux concentrators requires less word current so that total power consumption decreases.

We claim:

1. A magnetic random access memory comprising:

a semiconductor substrate;

first, second, and third layers;

first and second sense lines;

a first magnetic material for storing states positioned between the first and second layers which apply a magnetic field to the first magnetic material, and positioned adjacent the first sense line which senses states stored in the first magnetic material; and a second magnetic material for storing states positioned between the second and third layers which apply a magnetic field to the second magnetic material, and positioned adjacent the second sense line which senses states stored in the second magnetic material, the first magnetic material positioned between the semiconductor substrate and the second magnetic material.

2. The magnetic random access memory of claim 1 further including a conductor line for electrically coupling the first and second sense lines.

3. The magnetic random access memory of claim 1 wherein the first, second, and third layers are word lines.

4. The magnetic random access memory of claim 3 wherein the first and third layers are digit lines and the second layer is a word line.

5. The magnetic random access memory of claim 1 wherein the first and third layers are word lines and the second layer is a digit line.

6. The magnetic random access memory of claim 4 wherein the digit lines are perpendicular to the word line.

7. The magnetic random access memory of claim 5 wherein the digit line is perpendicular to the word lines.

8. The magnetic random access memory of claim 1 wherein the first and second magnetic material is giant magnetoresistive material.

9. A magnetic random access memory comprising:

a semiconductor substrate;

first and second word lines;

first and second sense lines;

a first magnetic material for storing states positioned adjacent the first word line which applies a magnetic field to the first magnetic material, and positioned adjacent the first sense line which senses states stored in the first magnetic material;

a second magnetic material for storing states positioned adjacent the second word line which applies a magnetic field to the second magnetic material, and positioned adjacent the second sense line which senses states stored in the second magnetic material, the first magnetic material positioned between the semiconductor substrate and the second magnetic material;

a first flux concentrator adjacent to the first word line; and a second flux concentrator adjacent to the second word line.

10. The magnetic random access memory of claim 9 further including a conductor line for electrically coupling between the first and second sense lines.

11. The magnetic random access memory of claim 9 wherein the first and second magnetic materials are apart from the second and first word line, respectively, enough not to alternate states by a magnetic field created by the first and second word lines.

12. The magnetic random access memory having stacked memory cells of claim 9 wherein the first and second flux concentrators are permalloy.

13. The magnetic random access memory of claim 9 wherein the first and second magnetic materials are giant magnetoresistive material.

14. A magnetic random access memory having stacked memory cells comprising:

a semiconductor substrate having first and second portions;

a first word line formed on the first portion of the semiconductor substrate;

a first dielectric layer having a first portion formed on the word line and a second portion formed on the second portion of the semiconductor substrate;

a first magnetic material formed on the first portion of the first dielectric layer;

a first sense line formed on the second portion of the first dielectric layer and contacting the first magnetic material;

a second dielectric layer having a first portion formed on the magnetic material and a second portion formed on the first sense line;

a second word line formed on the first portion of the second dielectric layer;

a third dielectric layer having a first portion formed on the second word line and a second portion formed on the second portion of the dielectric layer;

a second magnetic material formed on the first portion of the third dielectric layer;

a second sense line formed on the second portion of the third dielectric layer and contacting the second magnetic material;

a fourth dielectric layer having a first portion formed on the second magnetic material and a second portion formed on the second sense line; and a third word line formed on the first portion of the fourth dielectric layer.

15. The magnetic random access memory of claim 14 wherein the first and third word lines are digit lines.

* * * * *